United States Patent
Li et al.

(10) Patent No.: US 12,494,432 B2
(45) Date of Patent: Dec. 9, 2025

(54) SEMICONDUCTOR STRUCTURE AND METHOD FOR FORMING THE SAME

(71) Applicant: TAIWAN SEMICONDUCTOR MANUFACTURING COMPANY LTD., Hsinchu (TW)

(72) Inventors: Meng-Hsien Li, Hsinchu (TW);
Ying-Hsin Hung, Hsinchu (TW);
Yu-Shan Yeh, Hsinchu County (TW);
Li-Min Chen, Hsinchu County (TW);
Neng-Jye Yang, Hsinchu (TW);
Kuo-Bin Huang, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 775 days.

(21) Appl. No.: 17/843,899

(22) Filed: Jun. 17, 2022

(65) Prior Publication Data
US 2023/0411296 A1    Dec. 21, 2023

(51) Int. Cl.
*H01L 23/535* (2006.01)
*H01L 21/768* (2006.01)
*H01L 23/532* (2006.01)

(52) U.S. Cl.
CPC ...... *H01L 23/535* (2013.01); *H01L 21/76846* (2013.01); *H01L 21/76865* (2013.01); *H01L 21/76895* (2013.01); *H01L 23/53266* (2013.01)

(58) Field of Classification Search
CPC ............. H01L 23/535; H01L 23/53266; H01L 21/76846; H01L 21/76865; H01L 21/76895
See application file for complete search history.

(56) References Cited

U.S. PATENT DOCUMENTS

2023/0411296 A1* 12/2023 Li ..................... H01L 21/76895

* cited by examiner

*Primary Examiner* — Mark V Prenty
(74) *Attorney, Agent, or Firm* — WPAT LAW; Anthony King

(57) ABSTRACT

A semiconductor structure includes a semiconductor substrate, a dielectric layer, a tungsten plug, a conductive plug, and a contact barrier. The dielectric layer is over a semiconductor substrate. The tungsten plug is in the dielectric layer. The conductive plug is on the tungsten plug. The contact barrier includes a sidewall barrier on a sidewall of the conductive plug and a bottom barrier between the conductive plug and the tungsten plug. A thickness of the sidewall barrier is greater than a thickness of the bottom barrier.

20 Claims, 13 Drawing Sheets

SEMICONDUCTOR STRUCTURE AND METHOD FOR FORMING THE SAME

BACKGROUND

Advances in semiconductor processing continue, resulting in further reductions in minimum feature sizes and process scaling. As the semiconductor process nodes advance to smaller minimum feature sizes, for example, of 28 nanometers, 22 nanometers, and below, the areas available for contact plugs on device features such as gates and the respective substrate are reduced. In addition, as materials used in semiconductor processes advance, additional impacts on contact resistance due to the use of these advanced materials are observed. Accordingly, the approaches for reducing the respective impact are being researched.

Contact plugs are used to form the vertical electrical connections between a conductor layer such as a first level metal and a substrate region or a gate region formed below that level in an integrated circuit structure. Commonly used contact plugs include tungsten plugs.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
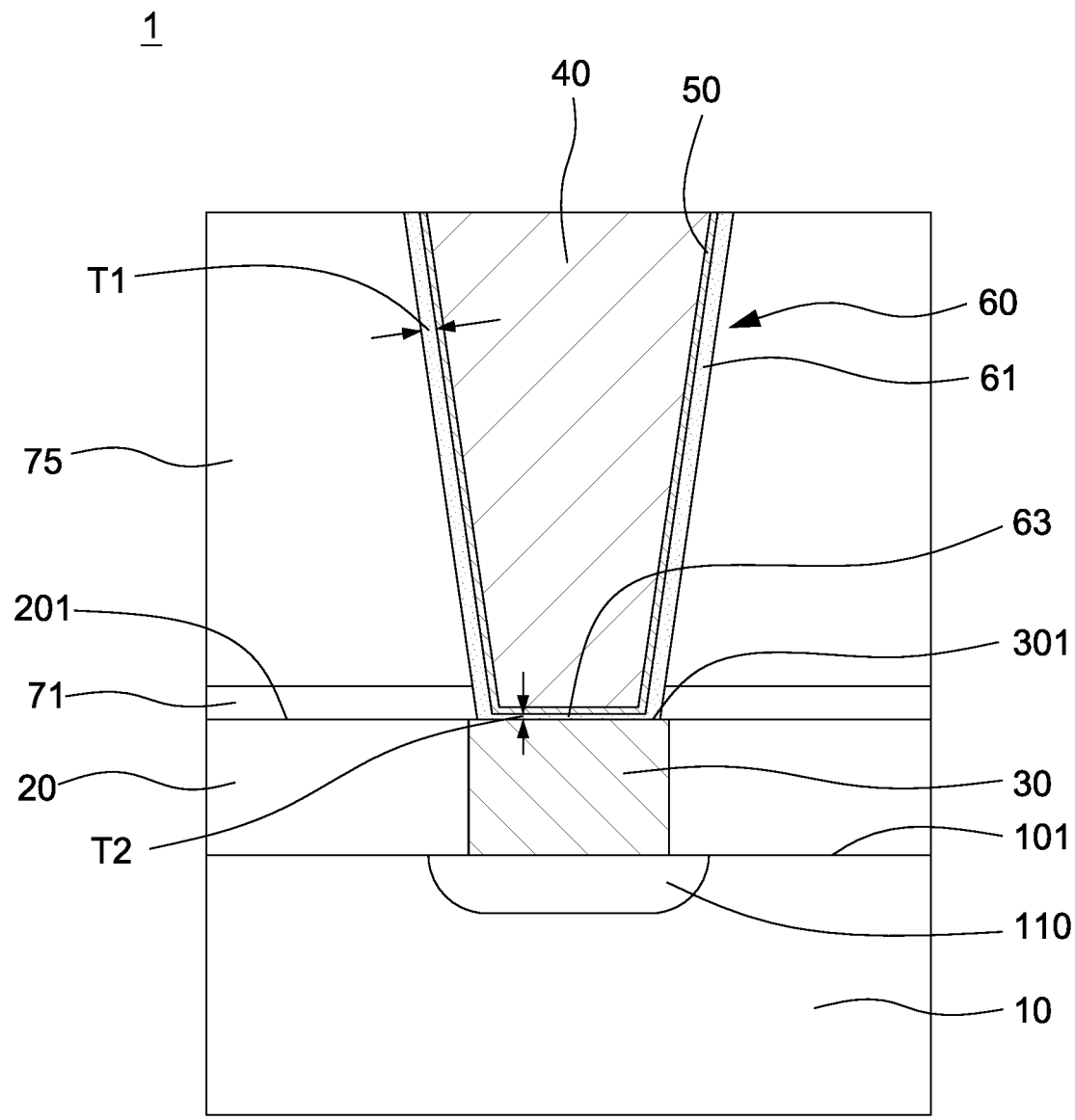
FIG. 1 is a cross-sectional view illustrating a semiconductor structure according to aspects of the present disclosure in one or more embodiments.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Embodiments of the present disclosure discuss a method for forming a semiconductor structure including forming a blocking layer covering an upper surface of a tungsten plug by electrostatic adsorption. With the design of the blocking layer, a barrier material may be selectively grown on a sidewall of a trench over the tungsten plug, thus a sidewall barrier with a desired thickness is formed only on the sidewall of the trench, and a bottom barrier/adhesive layer with a relatively thin thickness can be formed on the upper surface of the tungsten plug in a different subsequent process. The bottom barrier is relatively thin so as to reduce the contact resistance between the tungsten plug and a conductive plug formed thereon, and the adhesion between the tungsten plug and the conductive plug can be provided with sufficient stability to withstand subsequent thermal processes.

FIG. 1 is a cross-sectional view illustrating a semiconductor structure 1 according to aspects of the present disclosure in one or more embodiments.

Referring to FIG. 1, the semiconductor structure 1 includes a semiconductor substrate 10, a dielectric layer 20, a tungsten plug 30, a conductive plug 40, a conductive liner 50, a contact barrier 60, a contact etch stop layer (CESL) 71, and a dielectric structure 75.

The semiconductor substrate 10 may include silicon, germanium, silicon germanium, silicon carbon, compound semiconductor materials, or other proper semiconductor materials. The semiconductor substrate 10 may be a bulk substrate or constructed as a semiconductor on an insulator (SOI) substrate. In some embodiments, the semiconductor substrate 10 includes a conductive feature 110. The conductive feature 110 may be exposed by an upper surface 101 of the semiconductor substrate 10. In some embodiments, the conductive feature 110 may be a source/drain region. The source/drain region(s) hereinafter may refer to a source or a drain, individually or collectively dependent upon the context. In some embodiments, the conductive feature 110 may be a contact feature including silicide materials, such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof.

The dielectric layer 20 may be over the semiconductor substrate 10. In some embodiments, the dielectric layer 20 is formed on the conductive feature 110 and the upper surface 101 of the semiconductor substrate 10. The dielectric layer 20 may be referred to as an inter-layer dielectric (ILD). The dielectric layer 20 may be formed of an oxide such as phospho-silicate glass (PSG), born-silicate glass (BSG), boron-doped phospho-silicate glass (BPSG), tetra ethyl ortho silicate (TEOS) oxide, or the like.

The tungsten plug 30 may be in the dielectric layer 20. In some embodiments, the tungsten plug 30 is disposed on the conductive feature 110 of the semiconductor substrate 10. In some embodiments, the tungsten plug 30 is electrically connected to the conductive feature 110 of the semiconductor substrate 10. In some embodiments, the tungsten plug 30 is exposed by an upper surface 201 of the dielectric layer 20. In some embodiments, an upper surface 301 of the tungsten plug 30 is substantially coplanar with the upper surface 201 of the dielectric layer 20. In some embodiments, the tungsten plug 30 is formed of tungsten or a tungsten alloy.

The conductive plug 40 may be on the tungsten plug 30. In some embodiments, the conductive plug 40 is disposed on the tungsten plug 30. In some embodiments, the conductive plug 40 is electrically connected to the tungsten plug 30. In some embodiments, the conductive plug 40 tapers towards the tungsten plug 30. In some embodiments, the conductive plug 40 includes copper, copper alloys, aluminum, tungsten, or other proper conductor materials.

The CESL 71 may be on the dielectric layer 20. In some embodiments, the CESL is formed on the upper surface 201 of the dielectric layer 20. In some embodiments, the CESL 71 defines an opening (or a through hole) allowing the conductive plug 40 to penetrate and connect to the tungsten plug 30. In some embodiments, the opening (or the through hole) of the CESL 71 is smaller than an area of the upper surface 301 of the tungsten plug 30. In some embodiments, a projection of the opening (or the through hole) of the CESL 71 is entirely within the area of the upper surface 301 of the tungsten plug 30. In some embodiments, the CESL 71 includes silicon nitride (SixNy), silicon oxide (SiOx), silicon oxynitride (SiON), silicon carbide (SiC), silicon oxycarbonitride (SiOCN), silicon carbonitride (SiCN), aluminum oxide (AlOx), or other suitable materials.

The dielectric structure 75 may be on the CESL 71. In some embodiments, the dielectric structure 75 is formed on an upper surface of the CESL 71. In some embodiments, the dielectric structure 75 has a trench in which the conductive plug 40 is formed. The trench may taper towards the tungsten plug 40. The trench is connected to the opening (or the through hole) of the CESL 71. In some embodiments, the dielectric structure 75 may include a single layer or multiple layers. In some embodiments, the dielectric structure 75 includes silicon oxide (SiOx), silicon nitride (SixNy), silicon oxynitride (SiON), dielectric material(s) with low dielectric constant (low-k), or combinations thereof. In some embodiments, the dielectric structure 75 includes a low-k dielectric material having a dielectric constant less than about 2.5.

The conductive liner 50 may be on the conductive plug 40. In some embodiments, the conductive liner 50 surrounds the conductive plug 40. In some embodiments, the conductive liner 50 contacts the conductive plug 40. In some embodiments, the conductive liner 50 is between the conductive plug 40 and the dielectric structure 75. In some embodiments, a portion of the conductive liner 50 is between the conductive plug 40 and the CESL 71. In some embodiments, a portion of the conductive liner 50 is between the conductive plug 40 and the tungsten plug 30. In some embodiments, the conductive liner 50 includes ruthenium, cobalt, tungsten, or a combination thereof.

The contact barrier 60 may be on the conductive plug 40. In some embodiments, the conductive barrier 60 includes a sidewall barrier 61 and a bottom barrier 63 (also referred to as "an adhesive layer" or "an interfacial layer"). The sidewall harder 61 and the bottom barrier 63 may include the same material or different materials. The sidewall barrier 61 and the bottom barrier 63 may independently include titanium, titanium nitride, tantalum, tantalum nitride, or a combination thereof.

In some embodiments, the sidewall harder 61 is on a sidewall of the conductive plug 40. In some embodiments, the sidewall barrier 61 contacts the sidewall of the conductive plug 40. In some embodiments, the sidewall barrier 61 is between the sidewall of the conductive plug 40 and the sidewall of the trench of the dielectric structure 75. In some embodiments, the sidewall barrier 61 has a thickness T1 equal to or greater than about 10 Å. In some embodiments, the thickness T1 of the sidewall barrier 61 is from about 10 Å to about 20 Å, from about 12 Å to about 18 Å, or from about 14 Å to about 16 Å.

In some embodiments, the bottom barrier (or the adhesive layer) 63 is between the conductive plug 40 and the tungsten plug 30. In some embodiments, the bottom barrier 63 contacts the tungsten plug 30, In some embodiments, the bottom barrier 63 is between a bottom surface of the conductive plug 40 and the tungsten plug 30. In some embodiments, the bottom barrier 63 has a thickness T2 less than about 5 Å. In some embodiments, the thickness T1 of the sidewall harder 61 is greater than the thickness T2 of the bottom harder 63. In some embodiments, a ratio (T1/T2) of the thickness T1 of the sidewall barrier 61 to the thickness T2 of the bottom barrier 63 is greater than about 1.05. In some embodiments, the ratio (T1/T2) of the thickness T1 of the sidewall barrier 61 to the thickness T2 of the bottom harder 63 is from about 1.1 to about 10, from about 1.2 to about 8, from about 1.3 to about 6, from about 1.5 to about 4, from about 2 to about 3, or from about 2.3 to about 2.8. For example, in some embodiments, the contact resistance between the tungsten plug 30 and the conductive plug 40 is about 162Ω when the thickness T2 of the bottom barrier 63 is greater than 10 Å, and the contact resistance between the tungsten plug 30 and the conductive plug 40 is reduced to about 139Ω when the thickness T2 of the bottom barrier 63 is less than 5 Å.

In some embodiments, the conductive liner 50 is between the conductive plug 40 and the contact barrier 60. In some embodiments, the conductive liner 50 contacts the conductive plug 40 and the contact barrier 60. In some embodiments, the conductive liner 50 contacts the conductive plug 40 and the sidewall barrier 61 and the bottom barrier 63. In some embodiments, the contact barrier 60 surrounds the conductive liner 50. In some embodiments, the contact barrier 60 covers the conductive liner 50.

According to some embodiments of the present disclosure, with the design of the thickness T1 of the sidewall barrier 61 and the thickness T2 of the bottom barrier 63, the bottom barrier 63 is relatively thin so as to reduce the contact resistance between the tungsten plug 30 and the conductive plug 40, while the bottom barrier 63 remains with a sufficient amount to improve the interfacial property between the tungsten plug 30 and the conductive plug 40, thereby improving the adhesion between the tungsten plug 30 and the conductive plug 40. Therefore, the adhesion between the tungsten plug 30 and the conductive plug 40 is provided with sufficient stability to withstand subsequent thermal processes.

Figure 2:
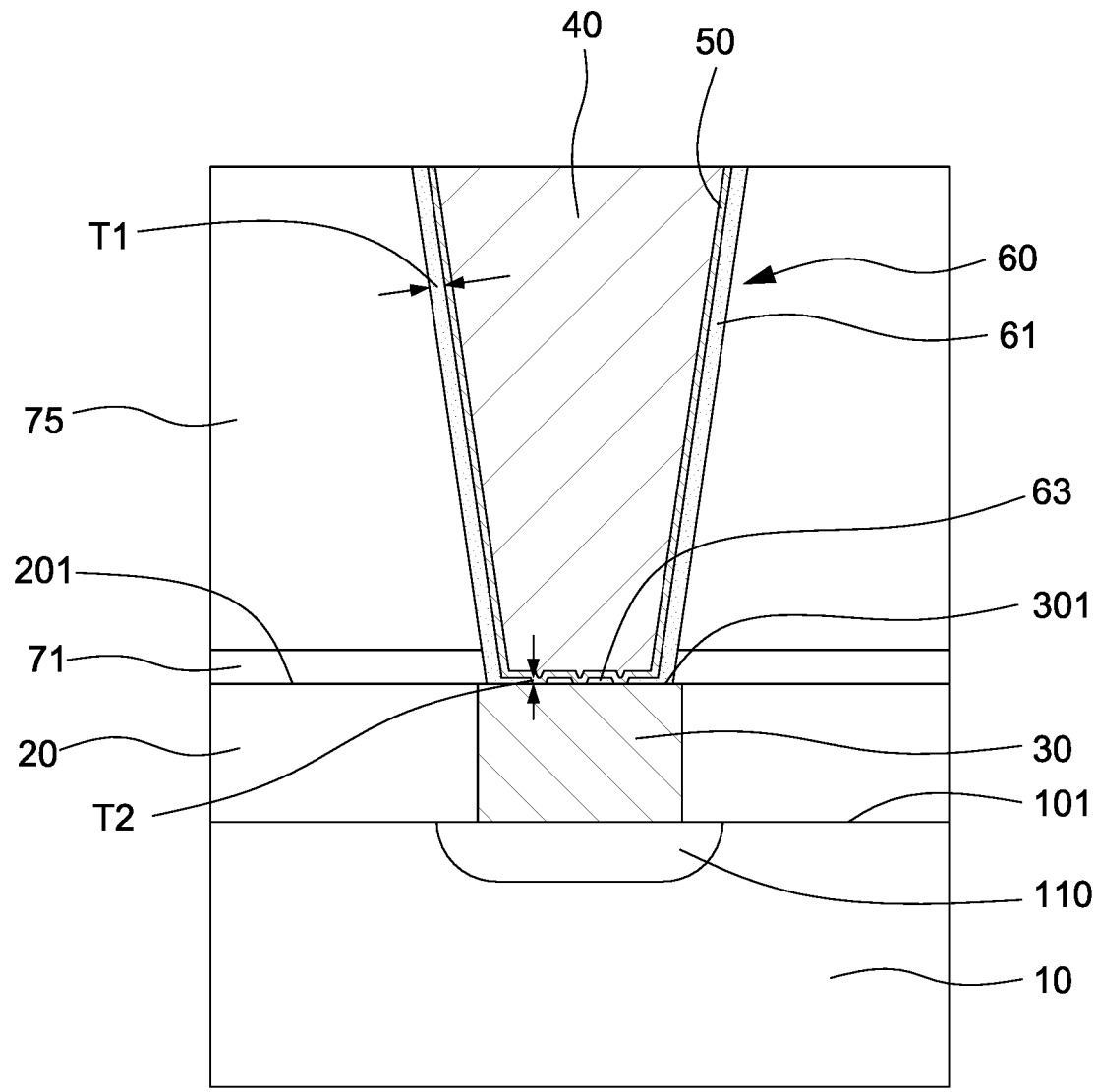
FIG. 2 is a cross-sectional view illustrating a semiconductor structure according to aspects of the present disclosure in one or more embodiments.

FIG. 2 is a cross-sectional view illustrating a semiconductor structure 2 according to aspects of the present disclosure in one or more embodiments. In some embodiments, the semiconductor structure 2 is similar to the semiconductor structure 1 in FIG. 1, with differences therebetween as follows. Descriptions of similar components are omitted.

In some embodiments, the bottom barrier 63 includes an irregular structure. In some embodiments, the bottom barrier 63 has an inconstant thickness T2. In some embodiments, the bottom barrier 63 has a non-planar upper surface. In some embodiments, the bottom barrier 63 includes a plurality of portions (or "islands") dispersedly disposed or formed on the upper surface 301 of the tungsten plug 30. In some embodiments, the upper surface 301 of the tungsten plug 30 is partially exposed by the portions of the bottom barrier 63. In some embodiments, at least two of the portions of the bottom barrier 63 have different thicknesses. In some embodiments, the portions of the bottom barrier 63 have irregular-shaped upper surfaces.

In some embodiments, the conductive line 50 is conformally formed on the portions of the bottom harrier 63. In some embodiments, a portion of the conductive liner 50 penetrates the bottom barrier 63 to contact the tungsten plug 30. In some embodiments, a portion of the conductive liner 50 extends between portions of the bottom barrier 63 to contact the tungsten plug 30. In some embodiments, a portion of the conductive plug 40 penetrates the bottom barrier 63. In some embodiments, a portion of the conductive plug 40 extends between portions of the bottom barrier 63.

Figure 3:
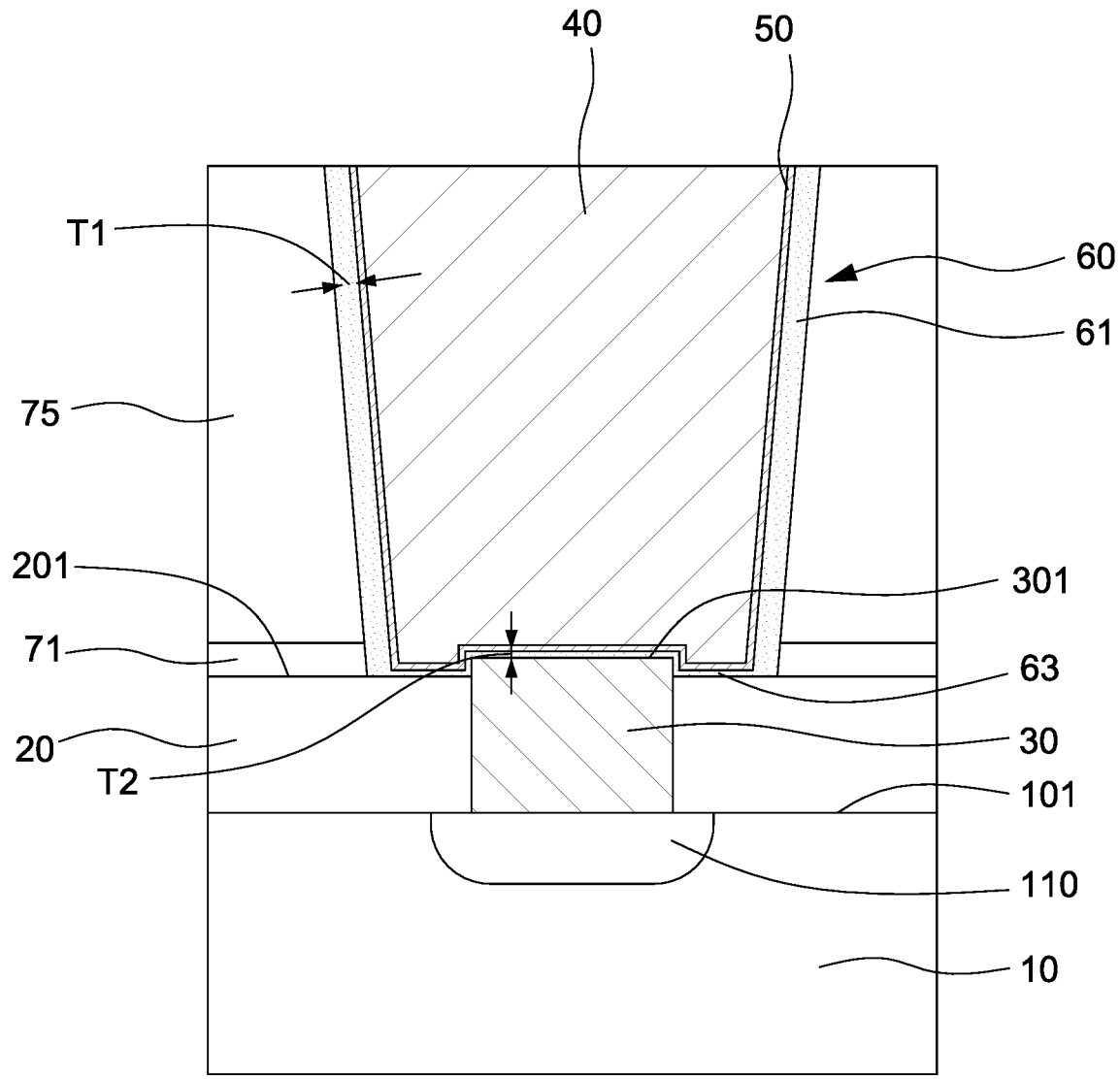
FIG. 3 is a cross-sectional view illustrating a semiconductor structure according to aspects of the present disclosure in one or more embodiments.

FIG. 3 is a cross-sectional view illustrating a semiconductor structure 3 according to aspects of the present disclosure in one or more embodiments. In some embodiments, the semiconductor structure 3 is similar to the semiconductor structure 1 in FIG. 1, with differences therebetween as follows, Descriptions of similar components are omitted.

In some embodiments, the tungsten plug 30 includes a protrusion extending upwards from the upper surface 201 of the dielectric layer 20. In some embodiments, the upper surface 301 of the tungsten plug 30 is at an elevation higher than an elevation of the upper surface 201 of the dielectric layer 20. In some embodiments, the opening (or the through hole) of the CESL 71 is larger than an area of the upper surface 301 of the tungsten plug 30. In some embodiments, a projection of the opening (or the through hole) of the CESL 71 exceeds the area of the upper surface 301 of the tungsten plug 30.

In some embodiments, the bottom barrier 63 conformally covers the protrusion of the tungsten plug 30. In some embodiments, a portion of the bottom barrier 63 contacts the dielectric layer 20. In some embodiments, a bottom surface of the conductive liner 50 is conformal with the portion of the bottom barrier 63 that covers the protrusion of the tungsten plug 30. In some embodiments, a bottom surface of the conductive plug 40 is conformal with the portion of the bottom barrier 63 that covers the protrusion of the tungsten plug 30.

FIGS. 4A to 4G are cross-sectional views illustrating a semiconductor structure 1 at various fabrication stages according to aspects of the present disclosure in one or more embodiments.

Figure 4A:
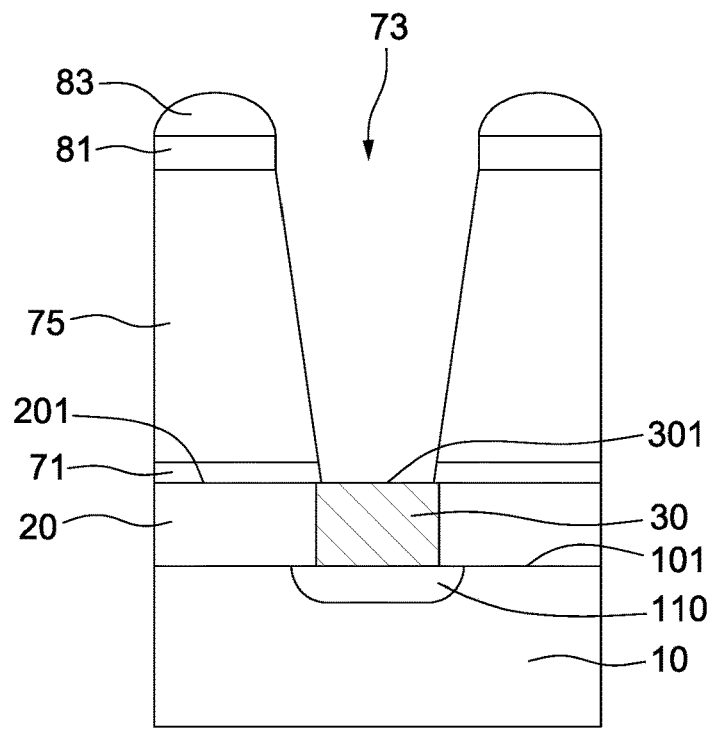
FIGS. 4A to 4G are cross-sectional views illustrating a semiconductor structure at various fabrication stages according to aspects of the present disclosure in one or more embodiments.

Referring to FIG. 4A, a semiconductor substrate 10 may be provided, a conductive feature 110 may be formed in the semiconductor substrate 10, a dielectric layer 20 may be formed on the semiconductor substrate 10, and a tungsten plug 30 may be formed in the dielectric layer. Then, a CESL 71 may be formed on the dielectric layer 20, a dielectric structure 75 may be formed on the CESL 71 over the dielectric layer 20, hard masks 81 and 83 may be formed on the dielectric structure 75, and a trench 73 may be formed according to the hard masks 81 and 83. The trench 73 may expose an upper surface 301 of the tungsten plug 30. In some embodiments, the hard mask 81 includes silicon oxide, and the hard mask 83 includes tungsten-doped-carbon (WdC).

In some embodiments, a CESL material is formed on the dielectric layer 20, and a dielectric material is formed on the CESI, material, the hardmask layers 81 and 83 are firmed on the dielectric material, and one or more etching processes may be performed to remove portions of the CESL material and the dielectric material to form the trench 73. Next, a baking process may be performed followed by a plasma cleaning process to remove residues from the etching processes. The baking process may be performed under a temperature of about 300° C. for about 1 minute to remove liquid residues from the etching processes. The plasma cleaning process may be an active pre-clean (APC) process using hydrogen radicals to remove solid residues from the etching processes.

Figure 4B:
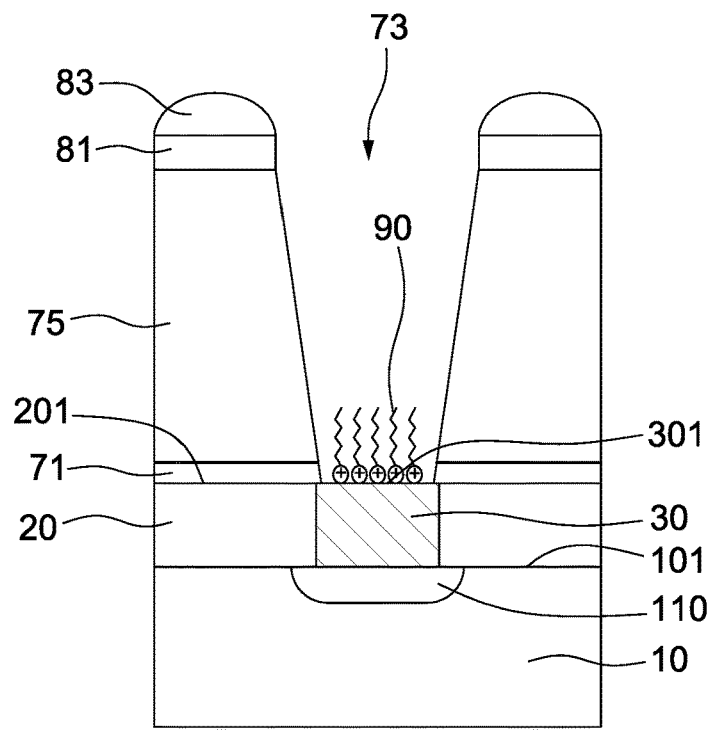

Referring to FIG. 4B, a blocking layer 90 may be formed to cover the upper surface 301 of the tungsten plug 30 by electrostatic adsorption. In some embodiments, the blocking layer 90 includes a monolayer of long-chain cationic compounds.

In some embodiments, forming the blocking layer 90 includes applying a chemical composition to the upper surface 301 of the tungsten plug 30. In some embodiments, the chemical composition is applied for about 60 seconds. In some embodiments, the chemical composition includes a solvent and a surfactant. In some embodiments, the chemical composition includes a solvent, a surfactant, and a pH buffer. In some embodiments, the chemical composition has a pH from about 4 to about 6 or from about 4 to about 5. In some embodiments, the surfactant of the chemical composition has a zeta potential of equal to or less than −45 mV. In some embodiments, the surfactant of the chemical composition has a zeta potential from about −45 mV to about −70 mV. In some embodiments, the chemical composition is free of hydrogen peroxide, amine, and chelating agents. For example, the chemical composition is free of benzotriazole and tolyltriazole.

In some embodiments, the solvent may include water and one or more polar organic solvents in which long-chain cationic compounds are soluble. In some embodiments, a weight ratio of water to the polar organic solvent may be from 60:40 to 80:20, e.g., 65:35, 70:30, or 75:25. The polar organic solvent may include aromatic compounds, alcohols, esters, ethers, ketones, amines, nitrated hydrocarbons, aldehyde, halo-hydrocarbon, halo-aromatic compounds, hydroaromatic compounds, glycols, glycerins, sulfoxides, or a combination thereof. In some embodiments, the polar organic solvent includes 4-methoxyiminobutanol (4-MA), dimethyl sulfoxide (DMSO), or a combination thereof. According to some embodiments of the present disclosure, with the design of the weight ratio of water to the polar organic solvent, the surfactant can be nicely miscible with water, and formation of bubbles can be prevented, which reduces the formation of defects.

In some embodiments, the surfactant may be represented by a formula: $R^1R^2R^3R^4N^+X^-$, wherein $R^1$, $R^2$, and $R^3$ are each independently selected from a group consisting of hydrogen atom, methyl, and ethyl, $R^4$ is C12-26 alkyl, and X is an anion (e.g., halide ions, such as chloride ion, bromide ion, and the like). In some embodiments, $R^4$ is C14-24 alkyl or C16-22 alkyl. In some embodiments, the surfactant may include cetyltrimethylammonium chloride ($C_{19}H_{42}ClN$), docosyl trimethylammonium chloride ($C_{25}H_{54}ClN$), or a combination thereof. In some embodiments, the weight percentage of the surfactant in the chemical composition is equal to or less than about 1 wt %. In some embodiments, the weight percentage of the surfactant in the chemical composition is from about 0.1 wt % to about 0.8 wt %, or from about 0.2 wt % to about 0.6 wt %.

In some embodiments, the pH buffer may include hexanoic acid. In some embodiments, the weight percentage of the pH buffer in the chemical composition is from about 1 wt % to about 2 wt %.

In some embodiments, the cationic heads of the long-chain cationic compounds of the blocking layer 90 are adsorbed to the anionic upper surface 301 of the tungsten plug 30 by electrostatic adsorption and form a monolayer with the tails of the long-chain cationic compounds extending upwards. The length of the tails may be equal to or less than about 1 Å. In some embodiments, the length of the tails of the long-Chain cationic compounds of the blocking layer 90 is from about 6 Å to about 10 Å or from about 6 Å to about 8 Å.

In some embodiments, a baking process may be performed on the tungsten plug 30 after forming the blocking layer 90 to remove liquid residues (e.g., water and solvent). In some embodiments, the baking process is performed under a temperature lower than a decomposition temperature of the blocking layer 90. In some embodiments, the temperature of the baking process may be lower than 310° C., 300° C., or 280° C. In some embodiments, the temperature of the baking process may be higher than about 200° C. In some embodiments, the temperature of the baking process may be from about 240° C. to about 260° C., e.g., about 250° C.

Figure 4C:
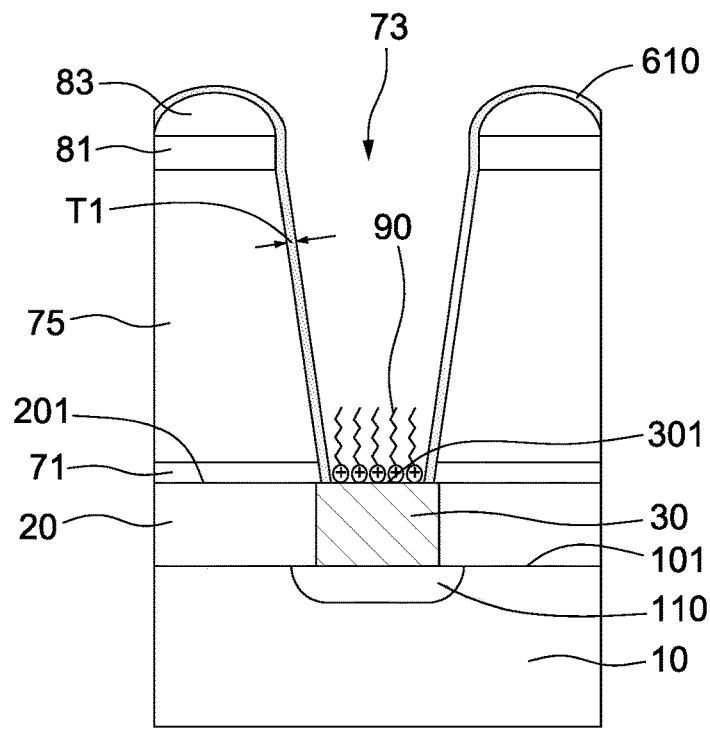

Referring to FIG. 4C, a sidewall barrier 610 may be formed on a sidewall of the trench 73. In some embodiments, the sidewall barrier 610 is formed by an atomic layer deposition (ALD) process. In some embodiments, the sidewall barrier 610 is formed by depositing a barrier material over the sidewall and the bottom of the trench 73 by an ALD process. With the blocking layer 90 covering the upper surface 301 of the tungsten plug 30, the barrier material may be selectively grown on the sidewall of the trench 73. In some embodiments, the upper surface 301 of the tungsten plug 30 is covered by the blocking layer 90 and free from the barrier material (or the sidewall barrier 610) deposited thereon. In some embodiments, the sidewall barrier 610 is further formed on the hard masks 81 and 83. In some embodiments, the sidewall harder 610 has a thickness T1 equal to or greater than about 10 Å. In some embodiments, the thickness T1 of the sidewall barrier 610 is from about 10 Å to about 20 Å, from about 12 Å to about 18 Å, or from about 14 Å to about 16 Å.

In some embodiments, since the chemical composition is applied to form a blocking layer 90 instead of performing an etching process or a removal process, a residue cleaning process or a post-rinse process (e.g., applying a cleaning solution followed by a drying process) is not required prior to forming the sidewall barrier 610. In some embodiments, there is free of a residue cleaning process or a post-rinse process between the process of forming the blocking layer 90 and the process of forming the sidewall barrier 610.

Figure 4D:
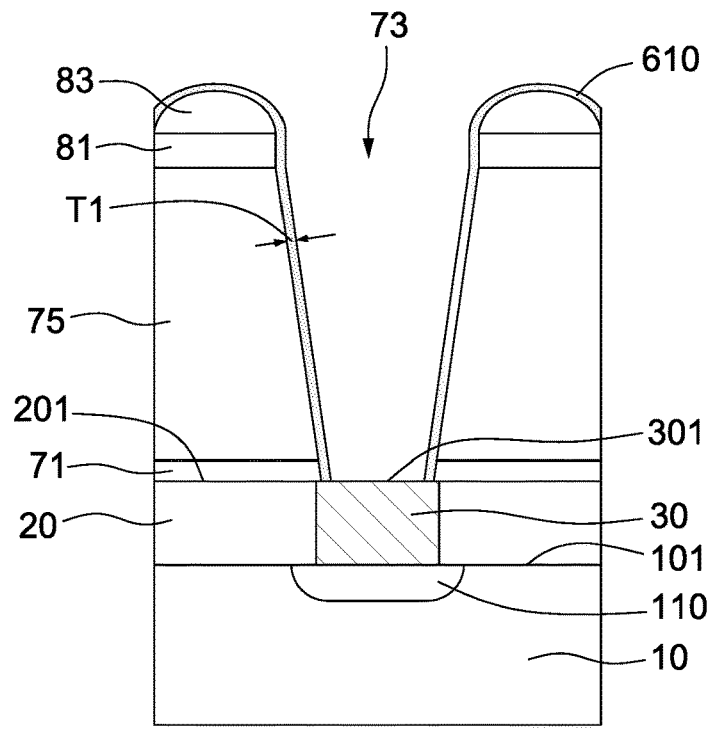

Referring to FIG. 4D, the blocking layer 90 may be removed from the upper surface 301 of the tungsten plug 30. In some embodiments, the blocking layer 90 is removed after the sidewall barrier 610 is formed. In some embodiments, the blocking layer 90 is removed by a plasma surface treatment process (or a dry etch process). In some embodiments, the plasma surface treatment process includes applying plasma with hydrogen gas as a process gas and argon gas as a carrier gas.

Figure 4E:
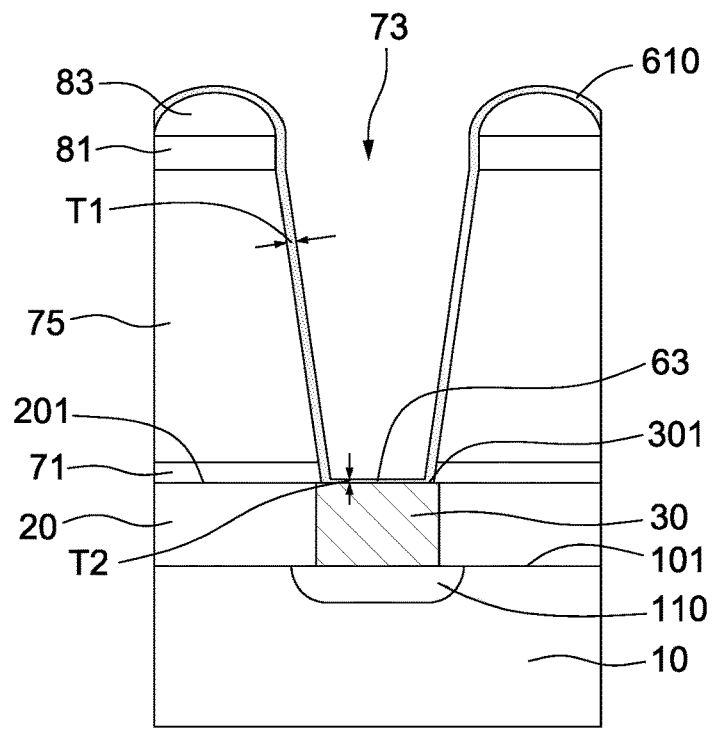

Referring to FIG. 4E, a bottom barrier 63 may be formed on the upper surface 301 of the tungsten plug 30 after the blocking layer 90 is removed. In some embodiments, the bottom barrier 63 is formed by a physical vapor deposition (PVD) process. In some embodiments, a thickness T2 of the bottom barrier 63 is less than the thickness T1 of the sidewall barrier 610. In some embodiments, the thickness T2 of the bottom barrier 63 is less than about 5 Å.

Figure 4F:
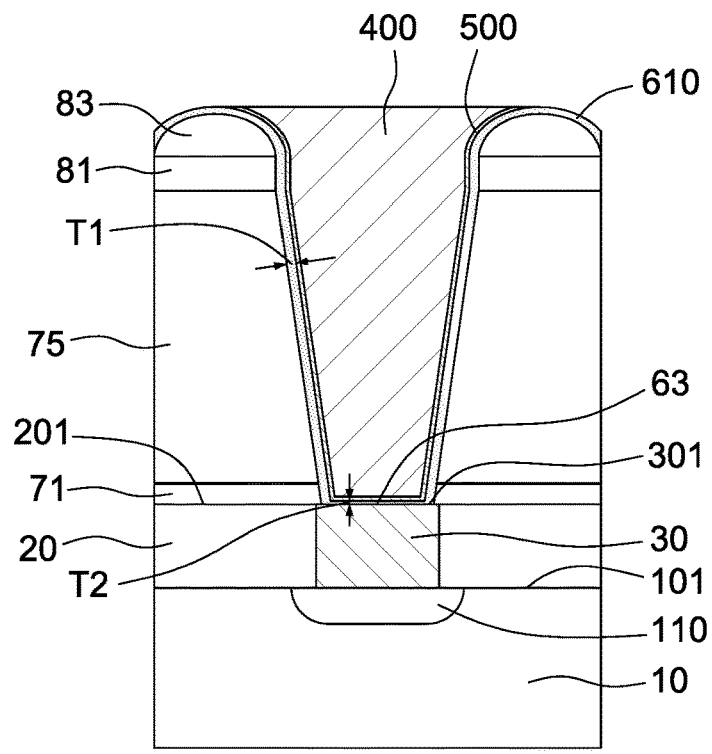

Referring to FIG. 4F, a conductive plug 400 may be formed in the trench 73 on the upper surface 301 of the tungsten plug 30. In some embodiments, a conductive liner 500 is formed in the trench 73 on the upper surface 301 of the tungsten plug 30, and the conductive plug 400 is formed on the conductive liner 50. In some embodiments, the conductive liner 500 is further formed on the sidewall barrier 610 on the hard masks 81 and 83. In some embodiments, the conductive liner 500 and the conductive plug 400 may be formed by any suitable deposition process, for example, an electrochemical plating (ECP) process, a DC PVD Co process, a RFDC PVD Co process, or the like.

Figure 4G:
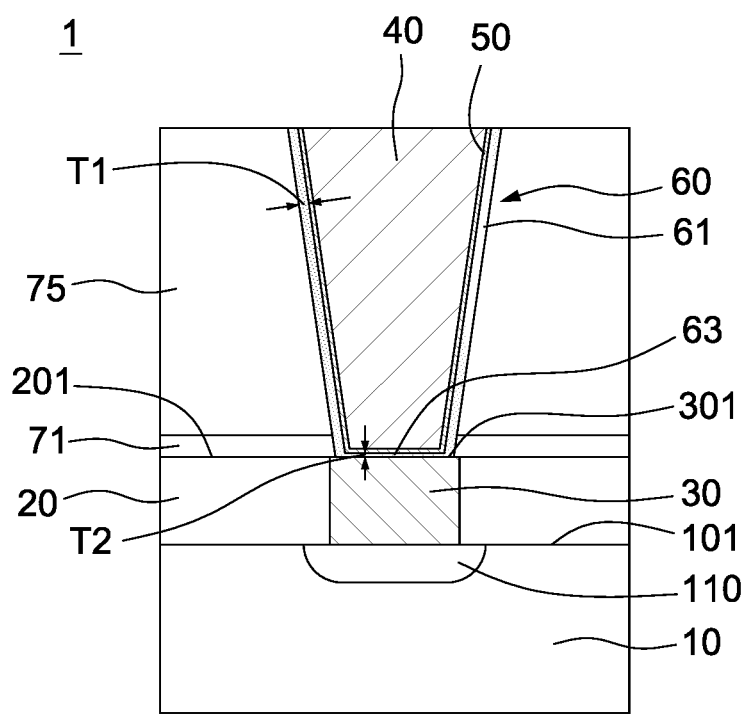

Referring to FIG. 4G, a suitable planarization technique such as a CMP process may be performed to remove excess materials from the upper surfaces of the dielectric structure 75, thereby exposing a top surface of conductive plug 40, a top surface of the conductive liner 50, and a top surface of the sidewall barrier 61. As such, the semiconductor structure 1 is formed.

According to some embodiments of the present disclosure, with the blocking layer covering the upper surface of the tungsten plug, the barrier material may be selectively grown on the sidewall of the trench, thus the sidewall barrier with a desired thickness is formed only on the sidewall of the trench, and a bottom barrier/adhesive layer with a relatively thin thickness can be formed on the upper surface of the tungsten plug in a different subsequent process. Therefore, while the sidewall barrier is relatively thick to prevent ions in different conductive features from diffusing to each other, the bottom barrier is relatively thin so as to reduce the contact resistance between the tungsten plug and the conductive plug, and the adhesion between the tungsten plug and the conductive plug can be provided with sufficient stability to withstand subsequent thermal processes.

In addition, according to some embodiments of the present disclosure, the chemical composition for forming the blocking layer contains relatively simple ingredients, e.g., including a solvent, a surfactant, and a pH buffer. The solvent can serve to dissolve the surfactant. The surfactant can serve to form the blocking layer. The pH buffer can provide an environment with a satisfactory zeta potential which favors the electrostatic adsorption between the tungsten plug and the molecules of the blocking layer, thereby enhancing the stability of the blocking layer adsorbed on the tungsten plug. Therefore, possible damages to the tungsten plug caused by additional additives in the chemical composition can be prevented.

Moreover, according to some embodiments of the present disclosure, the chemical composition is free of hydrogen peroxide, amine, and chelating agents. Therefore, the tungsten plug can be prevented from being oxidized by hydrogen peroxide, and a post-cleaning process for removing amine can be omitted. In addition, while metal complexes could have been formed from metal ions and chelating agents, thus formation of a multi-layered blocking structure from metal complexes stacked layer-by-layer can be prevented, and defects which could have been formed from the multi-layered blocking structure can be prevented.

Furthermore, according to some embodiments of the present disclosure, the surfactant of the chemical composition includes long-chain cationic compounds with an alkyl chain, the relatively high carbon ratio in the compound provides a relatively high thermal stability, which is advantageous to the process. In addition, compared to a blocking structure including molecules stacked in multiple layers by physisorption, the molecules on higher levels may desorb easily and fall off, which can generate defects, according to some embodiments of the present disclosure, the monolayer structure of the blocking layer provides a relatively stable blocking layer adsorbed on the tungsten plug, and thus formation of defects can be further prevented.

Figure 5A:
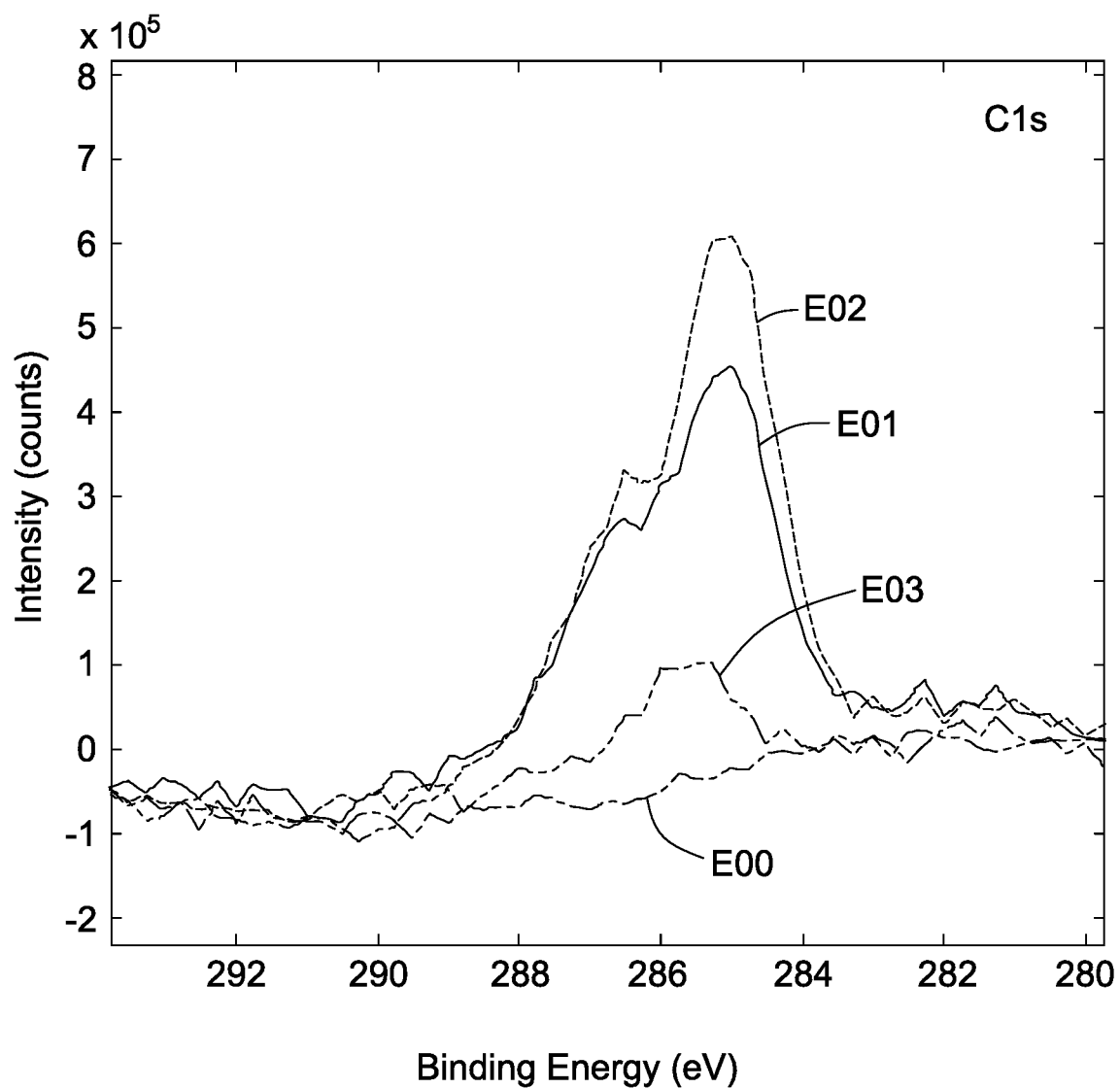
FIG. 5A shows XPS data of semiconductor structures according to aspects of the present disclosure in one or more embodiments.
Figure 5B:
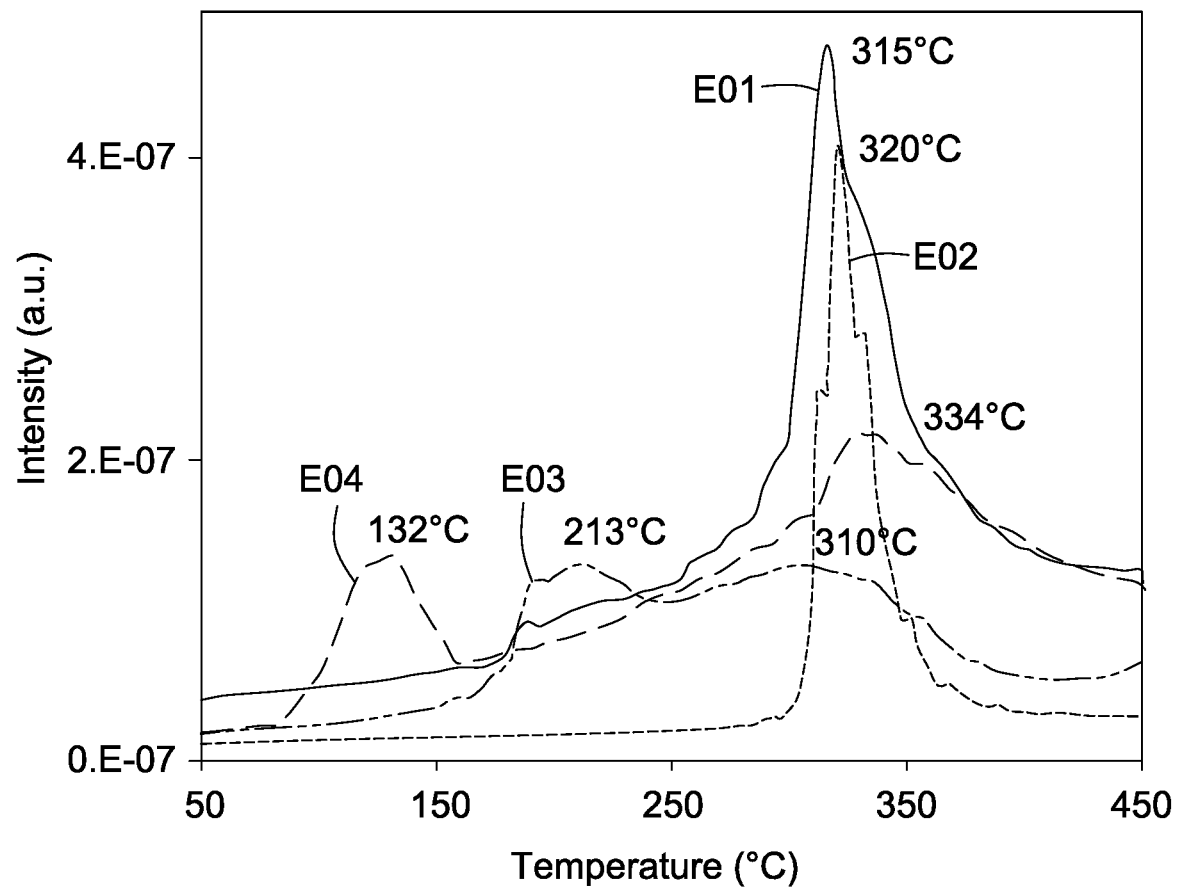
FIG. 5B shows results of thermal desorption spectroscopy (XPS) analysis of semiconductor structures according to aspects of the present disclosure in one or more embodiments.

Presented below are experimental results of properties of semiconductor structures formed by various processing steps according to embodiments of the present disclosure. FIG. 5A shows XPS data of semiconductor structures according to aspects of the present disclosure in one or more embodiments, and FIG. 5B shows results of thermal desorption spectroscopy (XPS) analysis of semiconductor structures according to aspects of the present disclosure in one or more embodiments. In FIGS. 5A-5B, embodiment E00 refers to an intermediate structure as illustrated in FIG. 4A (no blocking layer on the upper surface of the tungsten plug), and embodiments E01-E03 refer to an intermediate structure illustrated in FIG. 4B. Embodiments E01 and E02 use cetyltrimethylammonium chloride ($C_{19}H_{42}ClN$), docosyltrimethylammonium chloride ($C_{25}H_{54}ClN$), and embodiments E03 and E04 use benzotriazole derivatives as the blocking layer.

As shown in FIG. 5A, which is a C1s XPS analysis of the upper surface of the tungsten plug, embodiments E01 and E02 both show peaks having relatively high intensities showing bonding between tungsten and carbon (i.e., the molecules of the blocking layer adsorbed to the upper surface of the tungsten plug). This indicates that long-chain cationic compounds are adsorbed onto the upper surface of the tungsten plug serving as a blocking layer to cover the upper surface of the tungsten plug. As shown in FIG. 5A, embodiment E03 shows a peak having a relatively low intensity showing a weak bonding or interaction between tungsten and carbon.

As shown in FIG. 5B, the blocking layers of embodiments E01 and E02 do not thermally decompose until the temperature is higher than about 315° C. or 320° C., which shows a relatively high thermal stability. In addition, as shown in FIG. 5B, the blocking layers of embodiments E03 and E04 start to thermally decompose when the temperature reaches about 132° C. or 213° C., which shows a relatively poor thermal stability.

FIGS. 6A to 6D show XPS data of semiconductor structures according to aspects of the present disclosure in one or more embodiments.

Figure 6A:
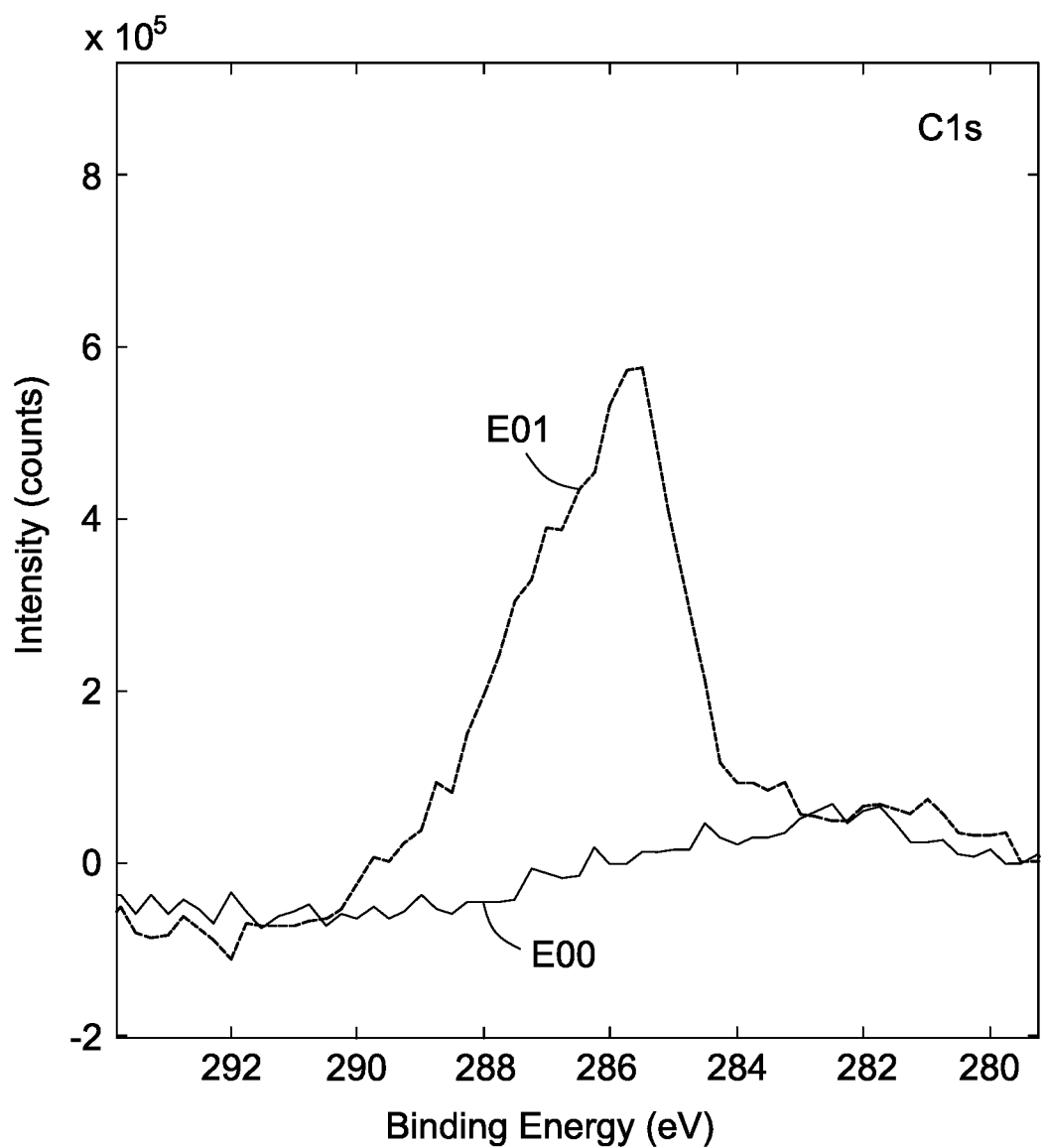
FIGS. 6A to 6D show XPS data of semiconductor structures according to aspects of the present disclosure in one or more embodiments.

As shown in FIG. 6A, which is a Cis XPS analysis of the upper surface of the tungsten plug, embodiment E01 shows a peak having a relatively high intensity showing bonding between tungsten and carbon (i.e., the molecules of the blocking layer adsorbed to the upper surface of the tungsten plug), and embodiment E00 shows no peak since no blocking layer is formed on the upper surface of the tungsten plug.

Figure 6B:
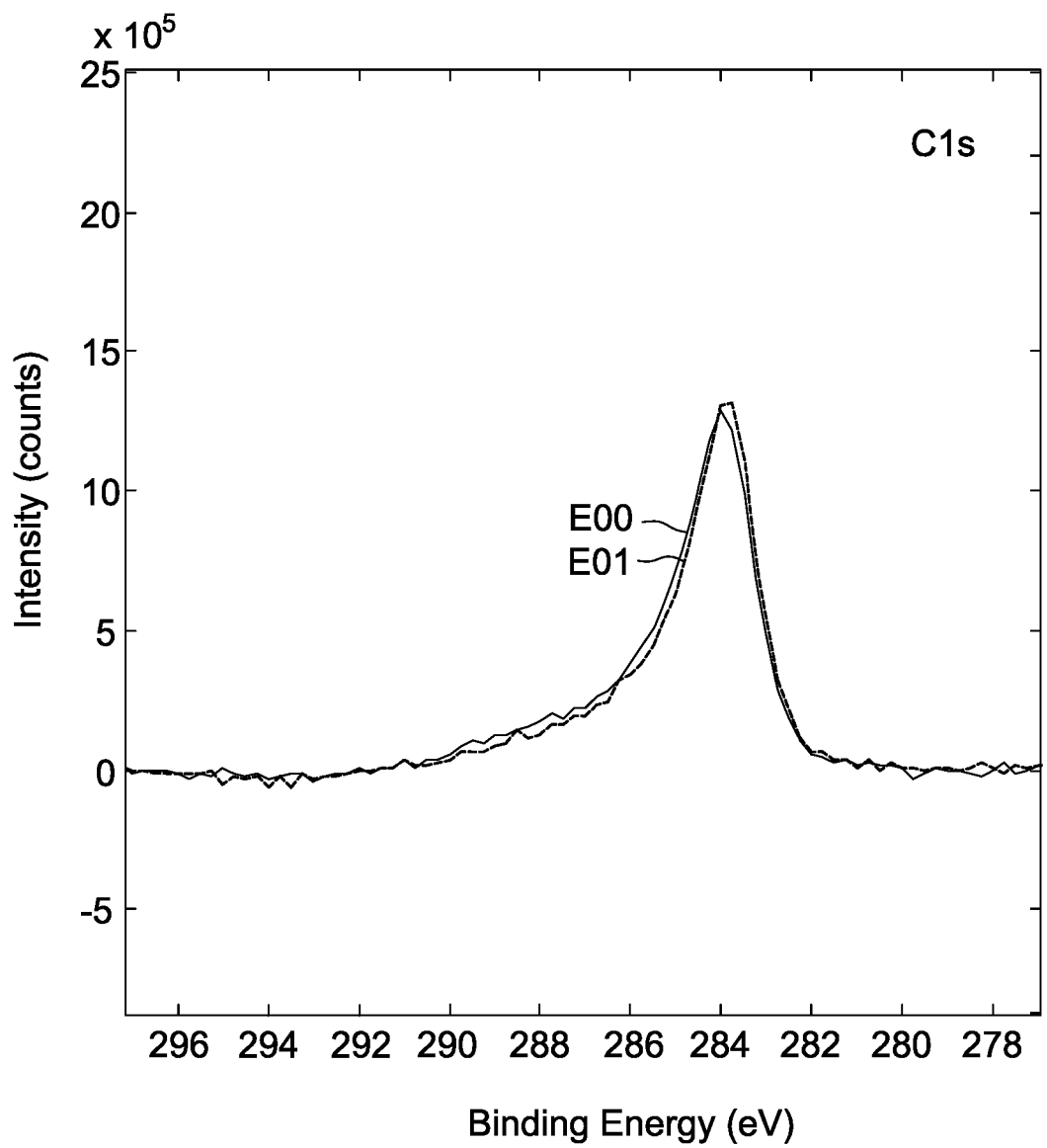

As shown in FIG. 6B, which is a Cis XPS analysis of the upper surface of the hard mask 83 that is made of tungsten-doped-carbon (WdC), embodiments E00 and E01 both show peaks at the same binding energy with the same peak intensity. The peaks show the bonding between tungsten and carbon within WdC (i.e., tungsten carbide), and embodiments E00 and E01 show not peaks indicating the bonding or interaction between tungsten and molecules from the blocking layer. The results from FIG. 6B show that the blocking layer is not bonded to the hard mask 83 that is made of WdC.

Figure 6C:
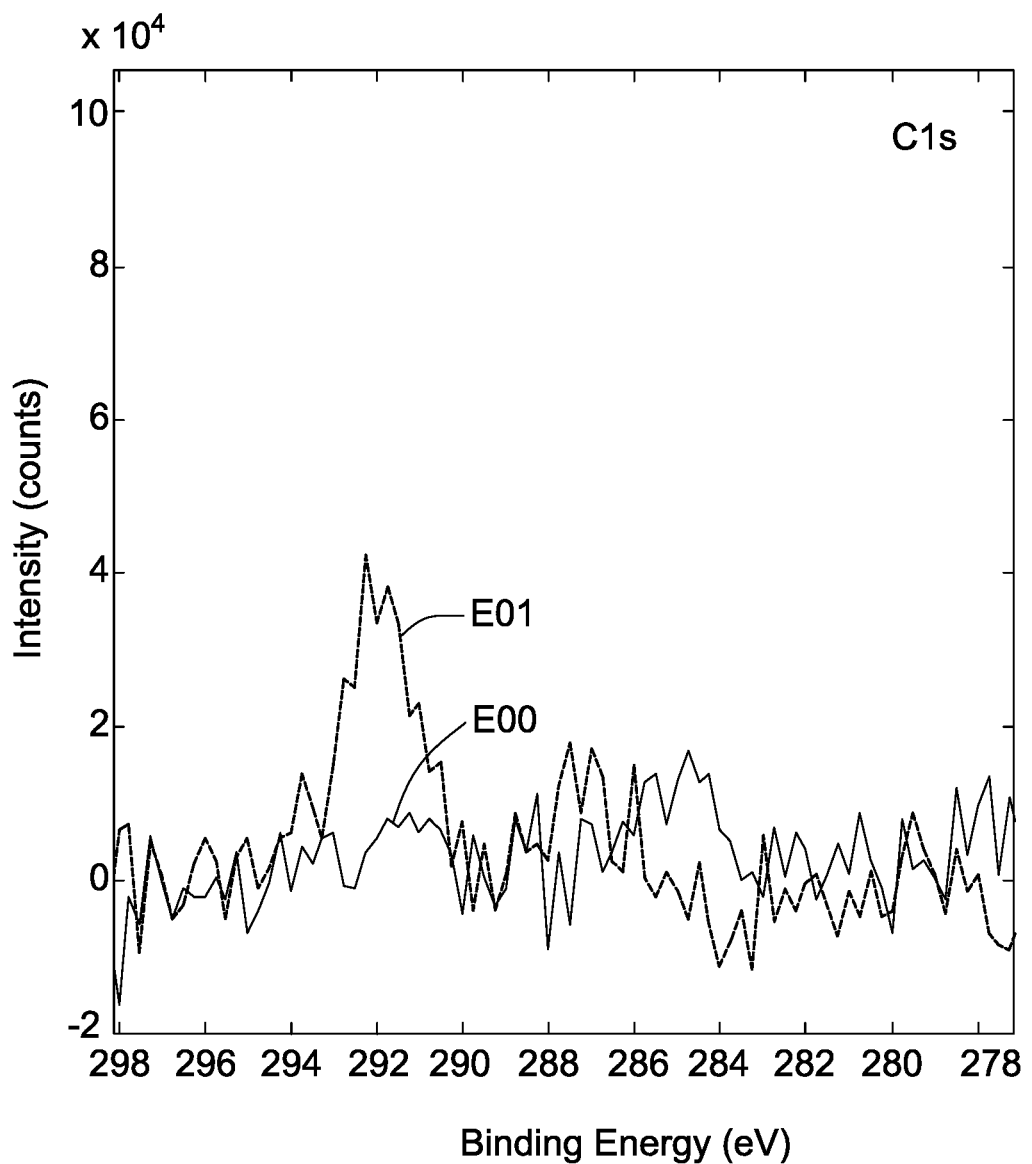

As shown in FIG. 6C, which is a C Is XPS analysis of the upper surface of the CESL 71 that is made of aluminum oxide, embodiment E01 only shows a relatively small peak indicating a small amount of carbon residue. The results from FIG. 6C show that the blocking layer is barely adsorbed to the CESL 71.

Figure 6D:
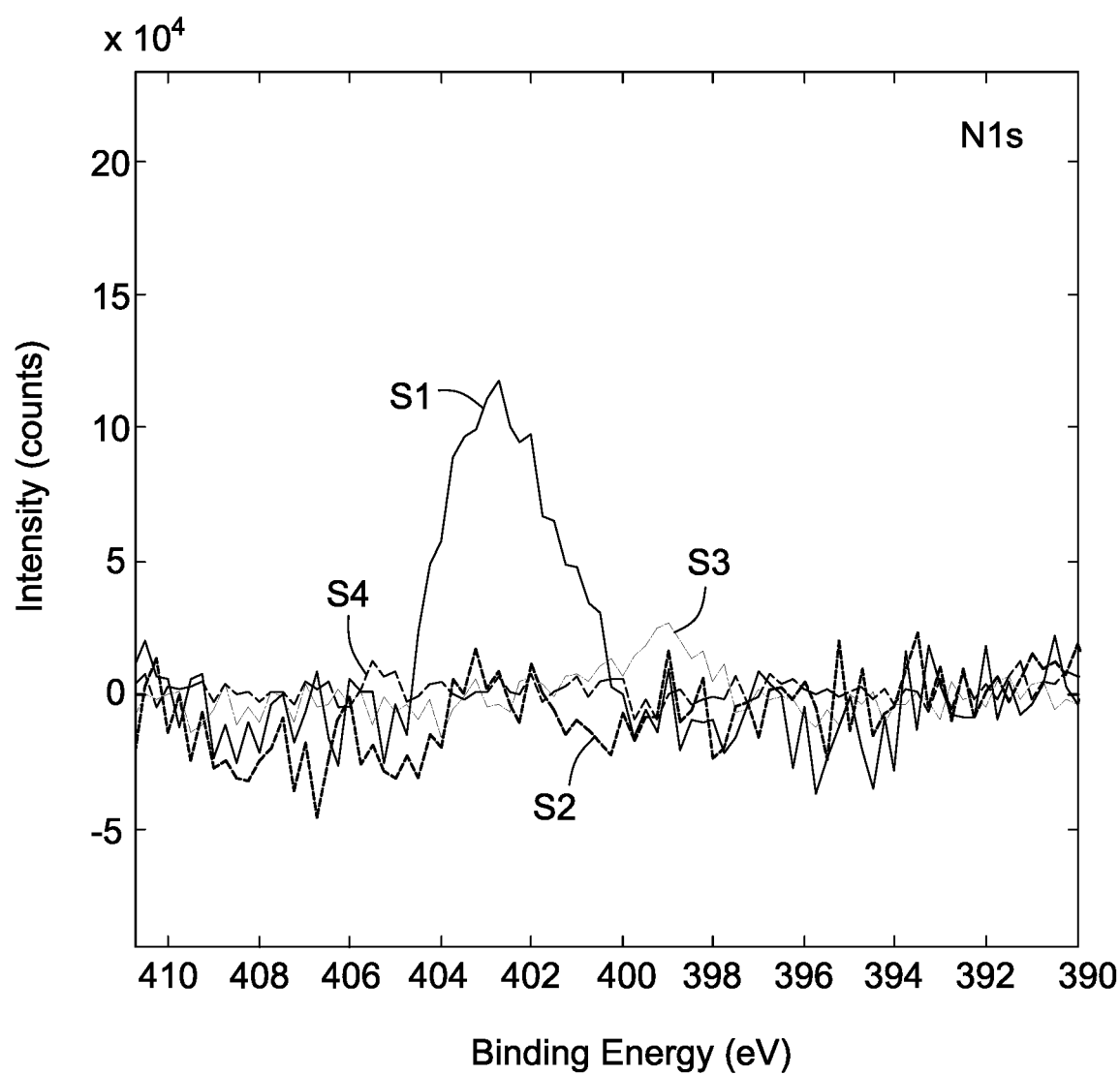

Referring to FIG. 6D, Nis XPS analysis of the upper surface of the tungsten plug (curve S1), the hard mask 83 that is made of WdC (curve S2), the CESL 71 (curve S3), and the dielectric structure 75 that is made of silicon oxide (curve S4) are shown. As shown in FIG. 6D, only curve S1 shows a peak having a relatively high intensity showing bonding between tungsten and nitrogen (i.e., the cationic heads of the long-chain molecules of the blocking layer adsorbed to the upper surface of the tungsten plug), and curves S2-S4 show no peaks. The results from FIG. 6D further show that the blocking layer is not bonded to the hard mask 83 that is made of WdC, the CESL 71, and the dielectric structure 75.

Some embodiments of the present disclosure provide a semiconductor structure. The semiconductor structure includes a semiconductor substrate, a dielectric layer, a tungsten plug, a conductive plug, and a contact barrier. The dielectric layer is over a semiconductor substrate. The tungsten plug is in the dielectric layer. The conductive plug is on the tungsten plug. The contact barrier includes a sidewall barrier on a sidewall of the conductive plug and a bottom barrier between the conductive plug and the tungsten plug. A thickness of the sidewall barrier is greater than a thickness of the bottom barrier.

Some embodiments of the present disclosure provide a semiconductor structure. The semiconductor structure includes a semiconductor substrate, a tungsten plug, a conductive plug, a sidewall barrier, and an adhesive layer. The semiconductor substrate includes a conductive feature. The tungsten plug is disposed on and electrically connected to the conductive feature. The conductive plug is disposed on and electrically connected to the tungsten plug. The sidewall barrier is on a sidewall of the conductive plug. The adhesive layer is between the conductive plug and the tungsten plug. The sidewall barrier and the adhesive later include a same material, and a ratio of a thickness of the sidewall barrier to a thickness of the adhesive layer is greater than 1.05.

Some embodiments of the present disclosure provide a method for forming a semiconductor structure. The method includes following operations: forming a tungsten plug in a dielectric layer over a semiconductor substrate; forming a dielectric structure over the dielectric layer, the dielectric structure having a trench exposing an upper surface of the tungsten plug; forming a blocking layer covering the upper surface of the tungsten plug by electrostatic adsorption; forming a sidewall barrier on a sidewall of the trench; removing the blocking layer from the upper surface of the tungsten plug; and forming a conductive plug in the trench on the upper surface of the tungsten plug.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a dielectric layer over a semiconductor substrate;
   a tungsten plug in the dielectric layer;
   a conductive plug on the tungsten plug; and
   a contact barrier comprising a sidewall barrier on a sidewall of the conductive plug and a bottom barrier between the conductive plug and the tungsten plug, wherein a thickness of the sidewall barrier is greater than a thickness of the bottom barrier.

2. The semiconductor structure of claim 1, wherein a ratio of the thickness of the sidewall barrier to the thickness of the bottom barrier is greater than 1.05.

3. The semiconductor structure of claim 1, wherein the thickness of the sidewall barrier is equal to or greater than about 10 Å, and the thickness of the bottom barrier is less than about 5 Å.

4. The semiconductor structure of claim 1, further comprising a conductive liner between the conductive plug and the contact barrier.

5. The semiconductor structure of claim 4, wherein a portion of the conductive liner penetrates the bottom barrier to contact the tungsten plug.

6. The semiconductor structure of claim 1, wherein the tungsten plug comprises a protrusion extending upwards from an upper surface of the dielectric layer, and the bottom barrier conformally covers the protrusion of the tungsten plug.

7. The semiconductor structure of claim 1, wherein a portion of the bottom barrier contacts the dielectric layer.

8. A semiconductor structure, comprising:
   a semiconductor substrate comprising a conductive feature;
   a tungsten plug disposed on and electrically connected to the conductive feature;
   a conductive plug disposed on and electrically connected to the tungsten plug;
   a sidewall barrier on a sidewall of the conductive plug; and
   an adhesive layer between the conductive plug and the tungsten plug, wherein the sidewall barrier and the adhesive layer comprise a same material, and a ratio of a thickness of the sidewall barrier to a thickness of the adhesive layer is greater than 1.05.

9. The semiconductor structure of claim 8, wherein the adhesive layer comprises titanium, titanium nitride, tantalum, tantalum nitride, or a combination thereof.

10. The semiconductor structure of claim 8, wherein the adhesive layer contacts the tungsten plug.

11. The semiconductor structure of claim 10, further comprising a conductive liner between and contacting the conductive plug and the adhesive layer.

12. The semiconductor structure of claim 8, wherein the thickness of the sidewall barrier is from about 10 Å to about 20 Å, and the thickness of the adhesive layer is less than about 5 Å.

13. The semiconductor structure of claim 8, further comprising a conductive liner between the conductive plug and the adhesive layer, wherein a portion of the conductive liner penetrates the adhesive layer to contact the tungsten plug.

14. A semiconductor structure, comprising:
   a tungsten plug a semiconductor substrate;
   a conductive plug on the tungsten plug;
   a sidewall barrier on a sidewall of the conductive plug; and
   a bottom barrier between the conductive plug and the tungsten plug, wherein a thickness of the sidewall barrier is equal to or greater than about 10 Å, and a ratio of a thickness of the sidewall barrier to a thickness of the bottom barrier is from about 1.1 to about 10.

15. The semiconductor structure of claim 14, further comprising a contact etch stop layer (CESL) over the semiconductor substrate, wherein the conductive plug penetrates the CESL to connect to the tungsten plug, and a bottom surface of the CESL is substantially aligned with a bottom surface of the bottom barrier.

16. The semiconductor structure of claim 15, further comprising a conductive liner disposed between the conductive plug and the sidewall barrier, wherein a bottom surface of the conductive liner is substantially aligned with the bottom surface of the CESL.

17. The semiconductor structure of claim 14, wherein the bottom barrier comprises a plurality of islands dispersedly disposed on an upper surface of the tungsten plug, and at least two of the islands have different thicknesses.

18. The semiconductor structure of claim 17, further comprising a conductive liner conformally formed on the islands of the bottom barrier, wherein a portion of the conductive liner contacts the upper surface of the tungsten plug.

19. The semiconductor structure of claim 14, further comprising a dielectric layer over the semiconductor substrate and a contact etch stop layer (CESL) over the dielectric layer, wherein a portion of the bottom barrier is within an opening of the CESL and contacting the dielectric layer and the tungsten plug.

20. The semiconductor structure of claim 19, wherein an elevation of a top surface of the tungsten plug is between an elevation of a top surface of the CESL and an elevation of a bottom surface of the CESL.

* * * * *